United States Patent [19]

Su et al.

[11] Patent Number: 5,536,669
[45] Date of Patent: Jul. 16, 1996

[54] METHOD FOR FABRICATING READ-ONLY-MEMORY DEVICES WITH SELF-ALIGNED CODE IMPLANTS

[75] Inventors: Kuan-Cheng Su, Taipei; Yi-Chung Sheng, Taichung; Chen-Hui Chung, Hsinchu, all of Taiwan

[73] Assignee: United Microelectronics Corporation, Hsinchu, China

[21] Appl. No.: 507,698

[22] Filed: Jul. 26, 1995

[51] Int. Cl.$^6$ ............................................. H01L 21/8246
[52] U.S. Cl. .................. 437/48; 437/45; 437/984
[58] Field of Search ............................... 437/45, 48, 931, 437/984; 148/DIG. 35

[56] References Cited

U.S. PATENT DOCUMENTS 5,200,355  4/1993  Choi et al. .
5,278,078  1/1994  Kanebako et al. .
5,449,632  9/1995  Hong .

*Primary Examiner*—Chandra Chaudhari
*Attorney, Agent, or Firm*—Fish & Richardson

[57] ABSTRACT

A method for fabricating ROM devices with self-aligned code implants comprises the steps of: forming an oxide layer over a silicon substrate; forming a plurality of deposition selecting strips over the oxide layer; forming a dielectric between the plurality of deposition selecting strips to thereby produce a plurality of dielectric strips; removing the deposition selecting strips; forming a number of code diffusion regions in the silicon substrate; and forming a plurality of word lines between the plurality of dielectric strips. Since the code diffusion regions are formed by implanting ions through the dielectric strips, the shielding of the dielectric strips can prevent the outspreading of impurities due to code mask mis-alignment. Therefore, the positions of code diffusion regions can be well controlled beneath the word lines.

12 Claims, 4 Drawing Sheets

METHOD FOR FABRICATING READ-ONLY-MEMORY DEVICES WITH SELF-ALIGNED CODE IMPLANTS

BACKGROUND OF THE INVENTION

1. Field of the Invention

The present invention relates to a method for fabricating semiconductor memory devices, and more specifically, to a method for fabricating read-only-memory (ROM) devices with self-aligned code implants.

2. Description of the Prior Art

Semiconductor ROM devices are generally composed of a plurality of memory cells which are formed by intersecting a number of bit lines and word lines on semiconductor substrates. Since each memory cell of the ROM device corresponds to a transistor, its on/off states can be well-controlled by properly adjusting the dopant concentration of the transistor's channel region. That is, the ROM devices are programmed through a specific arrangement of code diffusion regions in the semiconductor substrates, thus deciding the conducting states of the channel regions and the on/off states of the memory cells. These will be described in detail as follows.

In general, the code diffusion regions are formed by implanting ions into the semiconductor substrates through code masks, thus the name "mask ROM." A conventional manufacturing process for a mask ROM device will now be described in accompaniment with the cross-sectional views of FIG. 1 through FIG. 3. In the present example, the ROM device is fabricated on a silicon substrate having a P-type conductivity, that is, each memory cell is an N-type transistor.

First referring to FIG. 1, a gate oxide layer 13 and a polysilicon layer 15 are subsequently formed over silicon substrate 11. Since polysilicon layer 15 contains impurities, it has high conductivity and is provided for the word lines of the ROM device. Therefore, through a photolithography step and an etching step, polysilicon layer 15 is patterned into a plurality of word lines 16, as is depicted in FIG. 2.

It is noted that the structure of FIG. 2 may be subjected to an ion implantation step to form a plurality of bit lines in the substrate before the formation of word lines 16. Since the cross-sectional views of FIG. 1 through FIG. 3 are taken along the channel regions of the memory cells, the bit lines are not shown in the figures.

Further referring to FIG. 3, another photolithography step is performed to form a photoresist layer 17 as a code implant mask over the structure of FIG. 2. Photoresist layer 17 covers all memory cells but the channel regions of off-state memory cells. Then through code implant windows 18 defined by photoresist layer 17, P-type ions, such as boron ions, are implanted into the exposed channel regions of the memory cells to form code diffusion regions 19 in substrate 11.

The aforementioned ROM device operates by changing the voltage of word lines 16 between a high level and a low Level. For the "on"-cells, when the voltage of word lines 16 is at a high level, the channel regions beneath the word lines in the substrate will be turned on and current flow through the bit lines will be sensed. The "off"-cells have code diffusion regions 19, giving their channel regions a higher dopant concentration than that of the "on"-cells, so they need a higher threshold voltage to turn on the channels. That is, unless the high level voltage of the word lines increases, the memory cells having the code diffusion regions in their channel regions will maintain in the "off" state. Therefore, the ROM device can be programmed to contain both the "on"- and "off"-cells as desired.

However, the above-mentioned code implant process will result in impurity diffusion. Since the code implant mask, i.e., photoresist layer 17 in FIG. 3, may shift away through mis-alignment in the photolithography step, code diffusion regions 19 in substrate 11 will also shift away. With the shrinkage of the ROM device, if code diffusion regions 19 are not in their intended location, they will be very close to the channel regions of other memory cells. Since boron ions have a high diffusion coefficient, and they are generally utilized for code implantation as stated above, they will probably diffuse to the channel regions of any nearby memory cells, changing the dopant concentration therein. Therefore, an original "on"-cell may fail to turn on, thus becoming an "off"-cell due to the diffusion of boron ions.

The programming errors caused by the mis-alignment of the code mask and diffusion of impurities will become more serious as the dimension of the semiconductor device decreases. Therefore, the yield of the ROM memory devices can not be improved without modifying the conventional code implant process.

SUMMARY OF THE INVENTION

Accordingly, the present invention provides a method for fabricating ROM devices with self-aligned code implants, concentrating the impurities of the code diffusion regions beneath the word lines, and thus preventing their diffusion to other cells.

The method for fabricating ROM devices with self-aligned code implants according to one preferred embodiment of the present invention comprises the steps of: forming an oxide layer over the silicon substrate; forming a plurality of deposition selecting strips over the oxide layer; forming a plurality of dielectric strips between each two of the deposition selecting strips; removing the deposition selecting strips; forming a number of code diffusion regions in the silicon substrate; and forming a plurality of word lines between each two of the dielectric strips. Since the code diffusion regions are formed by implanting ions through the dielectric strips, the shielding of the dielectric strips prevents the spreading out of impurities due to the mis-alignment of code mask. Therefore, the positions of code diffusion regions can be well controlled beneath the word lines.

BRIEF DESCRIPTION OF THE DRAWINGS

Other objects, features, and advantages of the present invention will become apparent from the following detailed description of the preferred but non-limiting embodiments. The description is made with reference to the accompanying drawings in which.

DETAILED DESCRIPTION OF THE INVENTION

The cross-sectional views of FIG. 4 through FIG. 10 illustrate the fabrication process of a ROM device according to the preferred embodiment of the present invention. Even though the ROM device is fabricated on a P-type silicon substrate in the preferred embodiment, the method of the present invention can also be applied to form P-type memory devices on an N-type silicon substrate.

Figure 1:
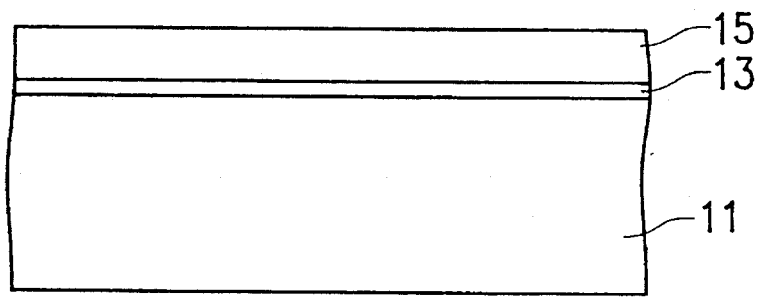
FIG. 1 through FIG. 3 are cross-sectional views illustrating a prior art process for fabricating a ROM device.
Figure 2:
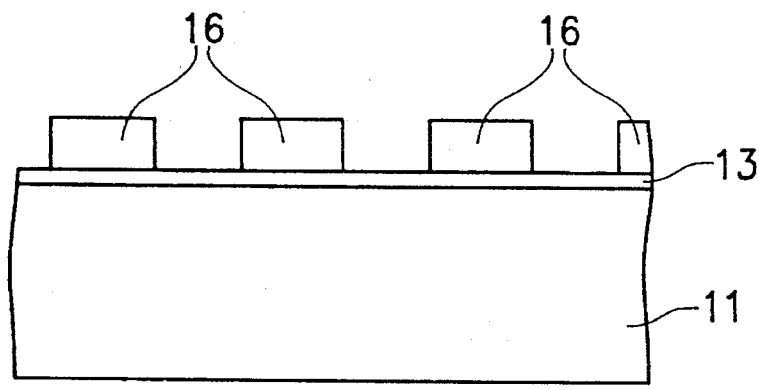
Figure 3:
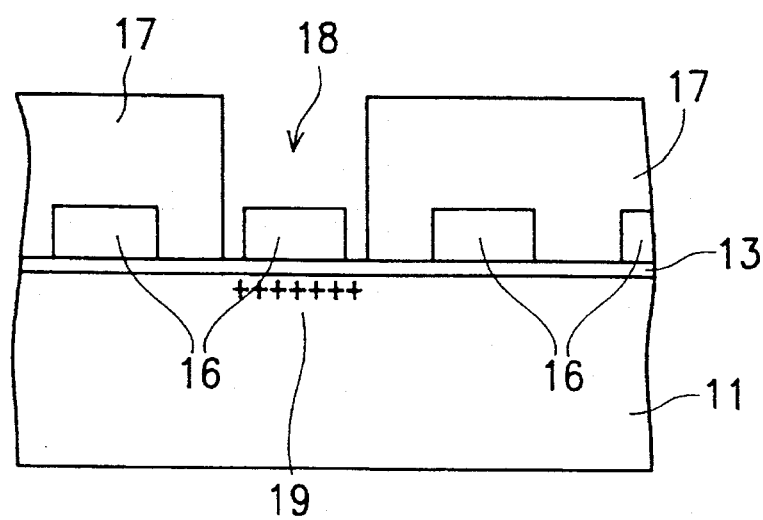
Figure 4:
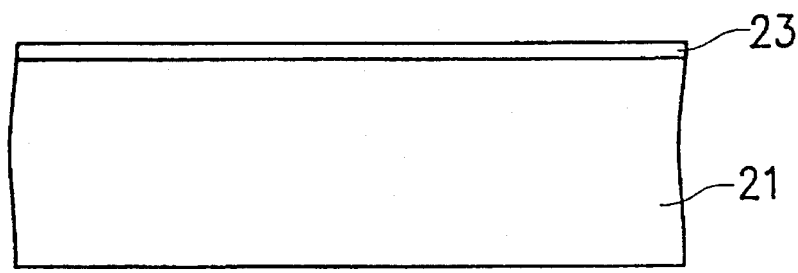
FIG. 4 through FIG. 10 are cross-sectional views illustrating the process for fabricating a ROM device according to the preferred embodiment of the invention.

Referring to FIG. 4, a P-type silicon substrate (or a P-type well region in an N-type silicon substrate) 21 is subjected to an oxidation step to form an oxide layer 23 thereon. Then an ion implantation step may be carried out to form a plurality of bit lines in silicon substrate 21. Since the cross-sectional views from FIG. 4 to FIG. 10 are all taken for illustrating channel regions of the ROM device, the bit lines are not shown in the figures. Nevertheless, the bit lines will be observed in a plan view (FIG. 11) of the ROM device when the process is finished.

Figure 5:
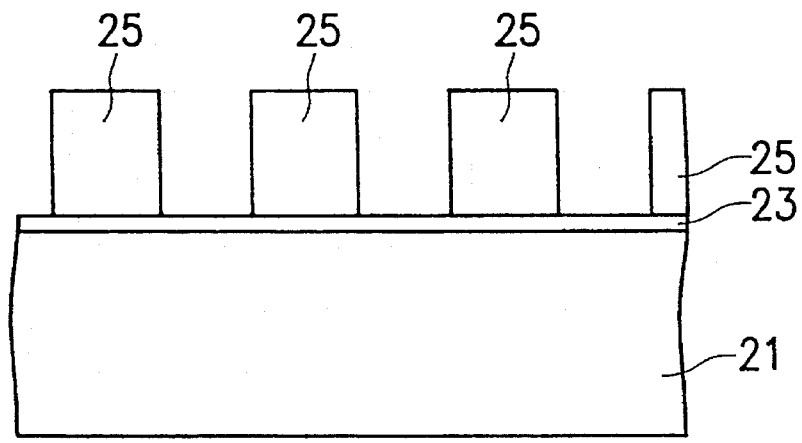

Next referring to FIG. 5, a plurality of deposition selecting strips 25 are formed over oxide layer 23. Deposition selecting strips 25 can be formed by photoresist or other materials that have good selectivity to the liquid-phase deposition (LPD) of silicon dioxide. In the preferred embodiment, a photoresist layer is formed over oxide layer 23 and then patterned in a photolithography step, thus forming deposition selecting strips 25.

Figure 6:
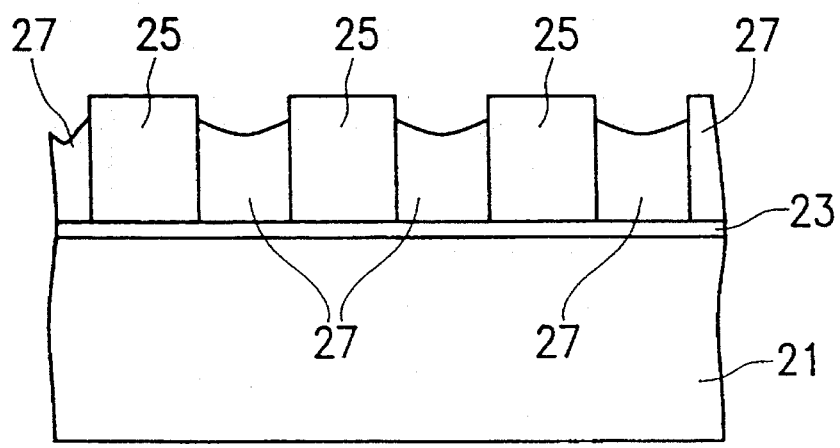

Therefore, the liquid-phase deposition of silicon dioxide can be performed to form a plurality of dielectric strips 27 between every two deposition selecting strips 25, as depicted in FIG. 6. The LPD process is based on the following two equations.

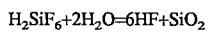

$$H_2SiF_6 + 2H_2O = 6HF + SiO_2$$

$$H_3BO_3 + 4HF = BF_4^- + H_3O^+ + 2H_2O$$

Therefore, dielectric strips 27 are formed only over the surface of oxide layer 23 between the photoresist strips, and the surface of photoresist strips 25 will not be deposited with the dielectric material. Since it is preferable that deposition selecting strips 25 have a thickness between 10K and 20KÅ, the LPD process is carried out to form the dielectric layer to a thickness between 1500 and 5000 Å.

Figure 7:
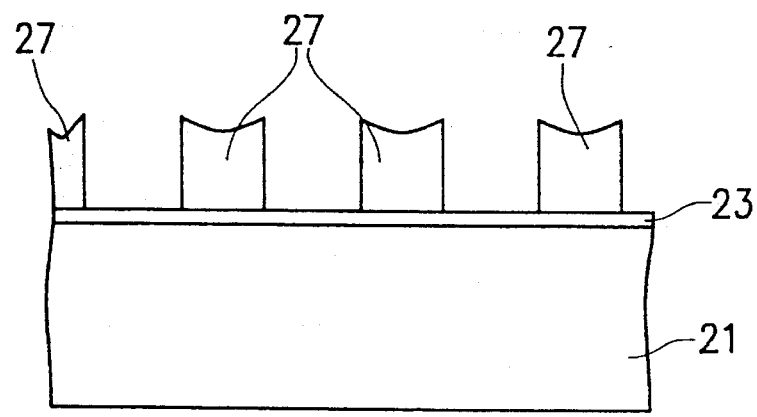
Figure 8:
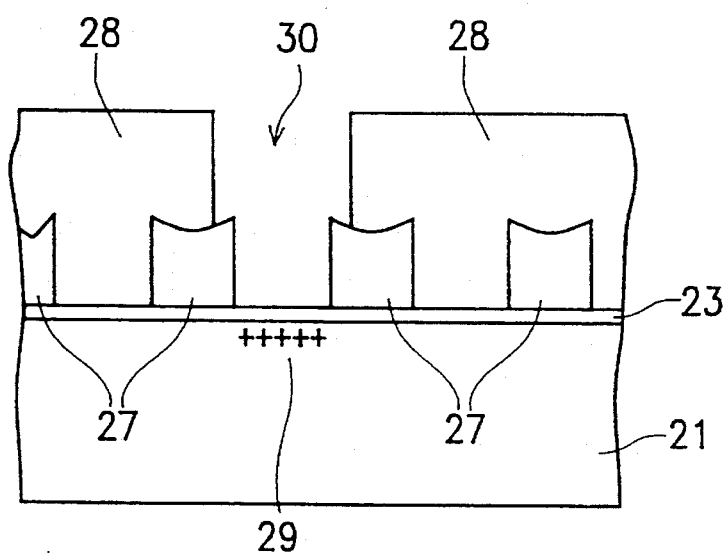

After removing deposition selecting strips 25, as depicted in FIG. 7, the code implant process can be performed through the shielding of dielectric strips 27. Referring to FIG. 8, a code mask 28 which can be a photoresist layer is formed over dielectric strips 27 and oxide layer 23 to expose a code implant window 30. An ion implantation step is then performed to form code diffusion region 29 in the substrate. The ion implantation step can be carried out by implanting boron ions (BF$_2$) at an implanting energy between 30 KeV and 90 KeV.

Figure 9:
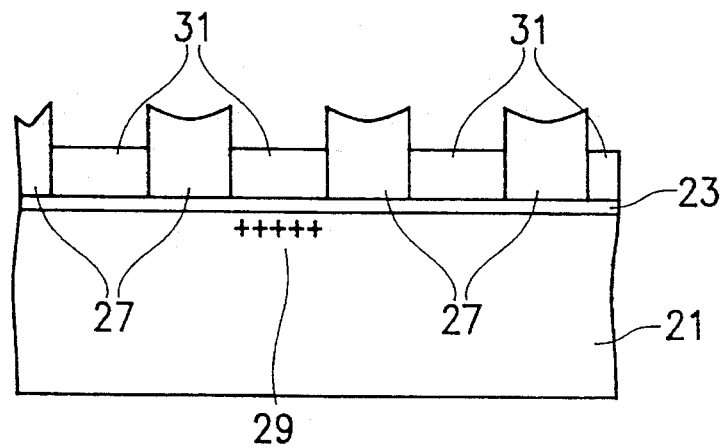

Further referring to FIG. 9, the code mask layer is removed and a plurality of word lines 31 are formed between each two dielectric strips 27. As has been stated in the prior art, the voltage levels of word lines 31 control the on/off states of the memory device, that is, word lines 31 are provided for the gate electrodes of the ROM device. In order to improve the quality of the gate oxide layer, oxide layer 23 between the dielectric strips 27 has been removed, and a new gate oxide layer has been formed by another oxidation step before the formation of word lines 31. In the preferred embodiment, word lines 31 can be formed by depositing a polysilicon layer over oxide layer 23 and dielectric strips 27, and then etching back the polysilicon layer to a thickness between 1000 and 4000 Å inside trenches formed by the dielectric strips. The conductivity of word lines 31 can be improved by doping impurities in the polysilicon layer during the deposition process or after its completion.

Figure 10:
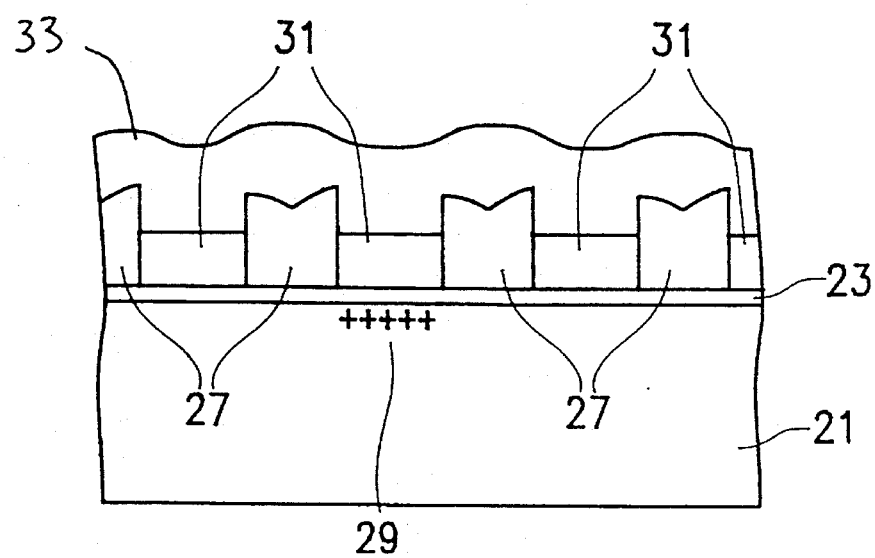

The structure of FIG. 9 may further be covered by a passivation layer 33 and then subjected to other post-processes, as shown in FIG. 10. The passivation layer can be a layer of boron-phosphorous silicate glass (BPSG) and the like. The post-processes may include the formation of contact windows, metallization, packaging and so on.

Figure 11:
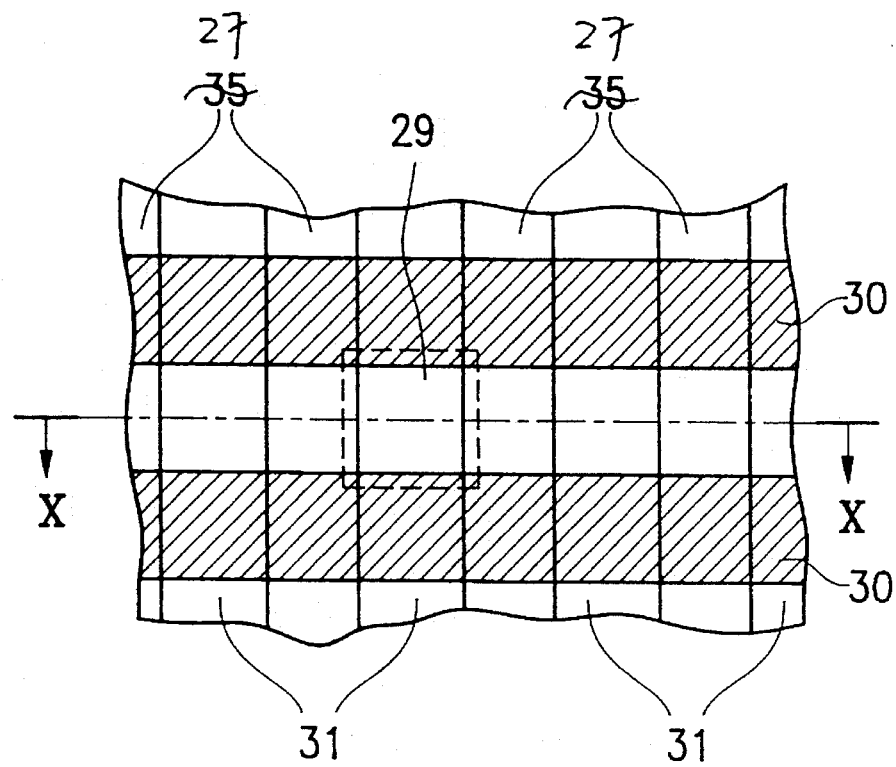
FIG. 11 is a plan view illustrating the ROM device of the preferred embodiment of the invention; wherein the cross-sectional view of FIG. 10 is taken along the X—X line of the figure.

A plan view of the final ROM device is illustrated in FIG. 11, wherein the cross-sectional view taken along the X—X line corresponds to FIG. 10. Referring to FIG. 11, a number of word lines 31 and bit lines 30 intersect to constitute the memory cells. There are also dielectric strips 27 between every two word lines 31. The region 29 encircled by dashed line is the code diffusion region which has been formed in the substrate by the code implant process. The location of region 29 will not shift away since the thickness of dielectric strips 27 is large enough to prevent ions from being implanted into the substrate due to the mis-alignment of the code implant mask during the code implant process. Therefore, impurities of the code diffusion region will concentrate beneath word lines 31, and their diffusion to the channel regions of other cells will not occur. That is, through the code implant process of the present invention, even the dimension of the ROM device is reduced, there will be no more programming errors due to impurity diffusion.

What is claimed is:

1. A method for fabricating read-only-memory (ROM) devices on a silicon substrate, comprising the steps of:

forming an oxide layer over said silicon substrate;

forming a plurality of bit lines in said silicon substrate;

forming a plurality of deposition selecting strips over said oxide layer;

forming a dielectric between said plurality of deposition selecting strips to thereby produce a plurality of dielectric strips;

removing said deposition selecting strips;

forming a number of code diffusion regions in said silicon substrate; and forming a plurality of word lines between said plurality of dielectric strips.

2. The method of claim 1, wherein said dielectric strips are formed by liquid-phase deposition of silicon dioxide.

3. The method of claim 1, wherein said deposition selecting strips are formed by photoresist.

4. The method of claim 1, wherein said word lines are polysilicon.

5. The method of claim 4, wherein said word lines are formed by depositing a polysilicon layer over said oxide layer and said dielectric trips; and etching back said polysilicon layer to form the word lines.

6. The method of claim 1, wherein said code diffusion regions are formed by implanting ions into said silicon substrate through a code mask.

7. The method of claim 5, wherein said silicon substrate is a P-type silicon substrate.

8. The method of claim 6, wherein said code diffusion regions are formed by implanting P-type ions into said substrate.

9. The method of claim 6, wherein said P-type ions are boron ions.

10. The method of claim 1, wherein said bit lines are formed by implanting ions into said silicon substrate.

11. The method of claim 1, wherein said deposition selecting strips have a thickness between 10K and 20KÅ.

12. The method of claim 1, wherein said dielectric strips have a thickness between 1500 and 5000 Å.

* * * * *